TRANSISTORIZED AUDIO POWER AMPLIFIER

Filed April 1, 1958 4 Sheets-Sheet 1

INVENTOR.
ERNEST C. WITZKE
BY
Eldon H. Luther

April 23, 1963 E. C. WITZKE 3,087,015

TRANSISTORIZED AUDIO POWER AMPLIFIER

Filed April 1, 1958 4 Sheets-Sheet 2

INVENTOR.
ERNEST C. WITZKE
BY
Eldon H. Luther

INVENTOR.
ERNEST C. WITZKE
BY
Eldon H. Luther

INVENTOR.
ERNEST C. WITZKE
BY
Eldon H. Luther

United States Patent Office 3,087,015
Patented Apr. 23, 1963

3,087,015
TRANSISTORIZED AUDIO POWER AMPLIFIER

Ernest C. Witzke, Bayside, N.Y.
(P.O. Box 306, Rocky Point, N.Y.)

Filed Apr. 1, 1958, Ser. No. 725,595
32 Claims. (Cl. 179—1)

This invention relates to amplifiers and particularly to high fidelity audio power amplifiers which will not require an audio power transformer for coupling the output stage to the load.

An object of the invention is the application of transistors in a direct coupled bridge type power output stage.

A further object is the provision of a phase inverter and bridge driving function without requiring frequency sensitive elements.

A still further object is the provision of a four transistor balanced bridge type power amplifier utilizing two transistors as power amplifiers, one transistor as a power amplifier phase inverter and balance circuit, and the fourth transistor as a power amplifier and drive for the other three transistors as required by a signal applied to the fourth transistor.

Other and additional objects will be apparent from the attached drawings and the following specification in which.

The purpose of this invention is to provide the circuitry for a high fidelity audio power amplifier which will not require the use of an audio power transformer for coupling the output stage to the load. Present designs for such equipment require the use of an expensive, high quality transformer to couple the output tubes or transistors to the load, which is normally a loudspeaker. This transformer is the primary source of distortion and poor frequency response in the amplifier, as well as being the most expensive item in its construction.

Audio power amplifiers using electron tubes require a transformer as an impedance matching device between the high characteristic impedance of the tubes and the low characteristic impedance of the loudspeaker, and as a means of isolating the D.C. currents required by the tubes from the loudspeaker. The advent of transistors eliminates the impedance matching requirement since they are low impedance devices and their circuitry may be made to match the loudspeaker impedance. If currently available loudspeakers are to be used, the circuit must be such as to eliminate the D.C. current required by the transistors from the loudspeaker path. Consequently, the loudspeaker cannot be directly connected to the transistor as a load by conventional circuitry, and the requirement for a D.C. path for the current through the transistor makes it impractical to couple the output stage to the load by means of a capacitor, since a choke equivalent to the transformer would be required.

Figure 1:
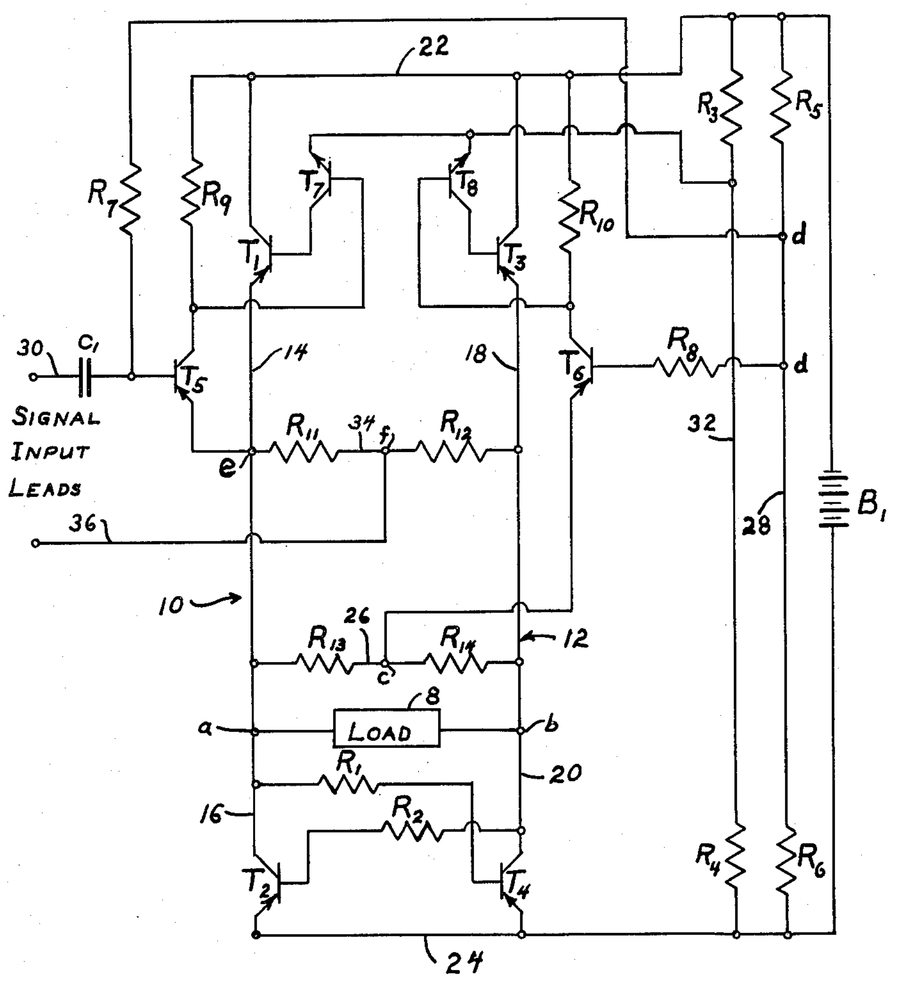
FIGURE 1 is a schematic wiring diagram for a transistor powered balanced bridge type class A power amplifier.

The balanced bridge audio power amplifier has been devised to permit the construction of a transistorized audio power amplifier without requiring the use of an audio power transformer. The basic circuit is illustrated in FIGURE 1. The output stage consists of four power transistors $T_1$, $T_2$, $T_3$, and $T_4$ arranged in the form of a Wheatstone bridge with the load or output 8 connected across the midpoints *a*, *b* of bridge branches 10, 12 by connections at said mid points. Branch 10 comprises leg 14 including transistor $T_1$ and leg 16 including transistor $T_2$. Branch 12 comprises leg 18 including transistor $T_3$ and leg 20 including transistor $T_4$. The collector of $T_2$ is connected to the emitter of $T_1$ and the collector of $T_4$ is connected to the emitter of $T_3$ so that the transistors of each branch are connected in series and conduct in the same direction. Under zero signal conditions, the amplifier is biased so that the bridge is balanced, the voltage across the load is zero, and the voltage of the load is about 50% of the battery voltage. A loudspeaker cannot tolerate a D.C. voltage, therefore all D.C. currents must by-pass the loudspeaker. In a balanced bridge no current flows in the cross-arm, cross-arm currents are produced only by unbalance in the bridge. The current in each of the output transistors is biased at a value slightly greater than 50% of the required maximum load current. One terminal 22 of the branches 10, 12 is connected to one side of a power source B, and the other terminal 24 of the branches is connected to the other side of the power source to supply the current through the transistors and for operating the load. The base of $T_4$ is connected to the midpoint of branch 10 through a resistor $R_1$ and the base of $T_2$ is connected to the midpoint of branch 12 through a resistor $R_2$. The central portion C of a voltage divider 26 comprising resistance $R_{13}$, $R_{14}$ connecting the midpoints of branches 10, 12 is connected to the emitter of a transistor $T_6$ whose collector is connected to branch terminal 22 through a resistor $R_{10}$. The base of $T_6$ is connected through a resistor $R_8$, which may be adjustable, to the central part *d* of a voltage divider 28 comprising resistances $R_5$ and $R_6$ connected across the power source $B_1$.

The central part *d* of voltage divider 28 is also connected to the base of transistor $T_5$ whose emitter is connected at *e* to the midpoint of branch 10 and whose collector is connected through resistance $R_9$ to terminal 22. The base of $T_5$ is also connected with signal lead 30 through a blocking condenser $C_1$.

The collector of $T_5$ is also connected to the base of transistor $T_7$ whose collector in turn is connected to the base of transistor $T_1$ in leg 14 of the bridge to provide an electrical connection between signal lead 30 and transistor $T_1$. The emitter of $T_7$ is connected to a bias voltage provided by a voltage divider 32 comprising resistances $R_3$ and $R_4$ connected across the power source $B_1$. In a similar manner the collector of $T_6$ is connected to the base of a transistor $T_8$ whose collector is connected in turn to the base of $T_3$ in leg 18 of the bridge and whose emitter is connected to voltage divider 32.

A voltage divider 34 comprising resistors $R_{11}$ and $R_{12}$ proportioned in accordance with a desired amplifier voltage gain is connected across the midpoints of branches 10, 12 and the point *f* between the resistances is connected to the other signal lead 36.

Unlike a vacuum tube, a transistor is a current multiplier as well as a voltage multiplier in an amplifier circuit, and it is this property which is used in this design. A current applied to the base of a transistor will be multiplied many times in the collector and emitter leads providing a voltage of the proper polarity is applied between the emitter and the collector. Accordingly, $R_1$ and $R_2$ are selected to apply current to the bases of $T_2$ and $T_4$ so, that under maximum signal conditions, a current in excess of the required maximum load current will flow through these transistors. It will be noted that when the bridge is unbalanced as when the voltage level at point *a* is higher than that at a point *b* more current will flow in $R_1$ and less will flow in $R_2$, and as a consequence $T_4$ will conduct heavily and $T_2$ will conduct lightly as is required to drive the load. The reverse is true for signals of opposite polarity. Under zero signal conditions the bridge is balanced and the voltage of points *a* and *b* cause sufficient current to flow through $R_1$ and $R_2$ so as to cause the current in $T_2$ and $T_4$ to be slightly greater than 50% of the maximum required load current. Control of the amplifier is therefore by means of transistors $T_1$ and $T_3$ since $T_2$ and $T_4$ act as followers. It will be noted that transistors $T_1$, $T_2$, $T_3$ and $T_4$ each contribute approximately 25% of the load output power.

It is necessary that the voltages of points *a* and *b* move in equal and opposite directions in response to signals. This is accomplished by means of the voltage divider $R_{13}$ and $R_{14}$. These resistors are equal in value, and as a result, the voltage at point *c* will be the average of the voltages at points *a* and *b*. Resistors $R_5$ and $R_6$ are approximately equal and form a voltage divider across the power source B, which provides, at point *d*, the D.C. voltage reference point of the amplifier. Transistor $T_3$ is operated so as to maintain points *c* and *d* at the same potential (ignoring the voltage drops in $R_8$ and the base of $T_6$ which are small) under all signal conditions, and thus $T_2$, $T_3$, and $T_4$ follow $T_1$.

Transistor $T_1$ is operated so that under zero signal conditions the bridge is unbalanced and no voltage appears across the load. This is accomplished by operating $T_1$ so as to cause the voltage at point *e* to equal the voltage at point *d* (again neglecting the drops in $R_7$ and the base of $T_5$). As a result, under zero signal conditions, an unbalance will be evidenced by a variation of the voltage of point *c* from that of point *d* and $T_3$ will be operated to restore balance by restoring the voltage at *c* to that of *d* so that the voltage at point *e* will equal the voltage at point *c* and no voltage will appear across the load.

It is necessary that the amplifier operate so that the voltage appearing across the load is proportional to the applied signal. This is accomplished by the voltage divider $R_{11}$ and $R_{12}$. These resistors are selected so that $R_{11}$ plus $R_{12}$ divided by $R_{11}$ equals the desired amplifier voltage gain. Point *f* serves as the signal return lead, and the signal is applied through the isolation capacitor $C_1$ to the base of $T_5$. If the amplifier consisting of $T_5$, $T_7$ and $T_1$ has sufficiently high voltage gain, the output stage will be operated so as to cause the voltage across $R_{11}$ to be very closely equal to the applied signal, and as a result the output voltage will be proportional to the input voltage as required. Transistors $T_2$, $T_3$ and $T_4$ will operate so as to follow the lead of $T_1$ in operating the bridge.

In a high gain feedback amplifier, the voltage gain is equal to $1/B$ where B is the part of the output that is fed back. If we define the open loop gain of the amplifier as K, then we may say that the gain of the amplifier has been changed by a factor of $1/KB$. The output impedance of the amplifier, and any internally generated noise and distortion have been reduced by a factor of KB, while the input impedance has been increased by the same amount, and will be effectively equal to $R_7$ in this case. It can be seen therefore, that by making KB large, an amplifier of very desirable properties results.

Transistors are available in both NPN and PNP types. The PNP types are designed to operate with their collectors negative, while NPN types operate with their collectors positive. In this design, all transistors with the exception of $T_7$ and $T_8$ are of the same type (e.g.—PNP) while transistors $T_7$ and $T_8$ are of the opposite type (e.g.—NPN). Resistors $R_3$ and $R_4$ form a voltage divider across the power source $B_1$ which maintains a voltage drop across $R_3$ of about 10% to 15% of the power source voltage (this value is not critical). $R_3$ is selected to have a low impedance. Resistor $R_{10}$, the collector resistor for $T_6$, and resistor $R_9$, the collector resistor for $T_5$ are selected to have a high impedance as compared to the combined impedances of the bases of the next stage and $R_3$. (The values of $R_9$ and $R_{10}$ may be on the order of 10 times the input impedances of the following stages if high stage gains are desired.) The base of a transistor acts as a rectifier, and will not pass any current unless its voltage is between that of the emitter and collector, and as a result, for low values of current in $T_5$ and $T_6$, all of the current flows through $R_9$ and $R_{10}$. As this current increases, the voltage drop in $R_9$ and $R_{10}$ exceeds that in $R_3$ and the bases of $T_7$ and $T_8$ begin to conduct. From this point on, practically all of the additional current flows through the bases of $T_1$ and $T_3$.

Since, under zero signal conditions current is passing through $T_2$, and $T_4$, it is necessary for this current to pass through $T_1$ and $T_3$, and therefore, $T_5$ and $T_7$ must conduct sufficiently to generate this current in $T_1$ and $T_3$. The base of $T_5$ is connected to the signal lead through $C_1$ and to a point *d* through $R_7$ while its emitter is connected to point *e*. If the voltage at point *e* does not agree with that applied to the base of transistor $T_5$, the current in $T_1$, which is controlled by the conduction of $T_5$ and $T_7$, is altered so as to correct this disagreement. By the same token the base of $T_6$ is connected to point *d* through $R_8$ and its emitter is connected to point *c*. If the voltage at point *c* does not agree with that at the base of $T_6$, the current in $T_3$, which is controlled by the conduction of $T_6$ and $T_8$, is altered to correct the disagreement. It can be seen therefore, that with a sufficiently high value of KB, the amplifier will perform as required.

The use of a high value of KB involves a stability problem in the amplifier. Since the amplifier is a direct coupled device, low frequency instability is not possible. High frequency instability may be caused by the high frequency cutoff characteristics of the transistors since more than two stages are involved. Standard techniques are known for providing high frequency stability in high gain feedback amplifiers with the exact techniques to be used depending upon the specific transistor and amplifier design parameters employed. As an example, one way to solve this instability problem may be by means of bypassing capacitors 38, 40, 42 and 44, FIGURE 3, without affecting response in the audio range since it will occur at a frequency far removed from the audio region.

Figure 2:
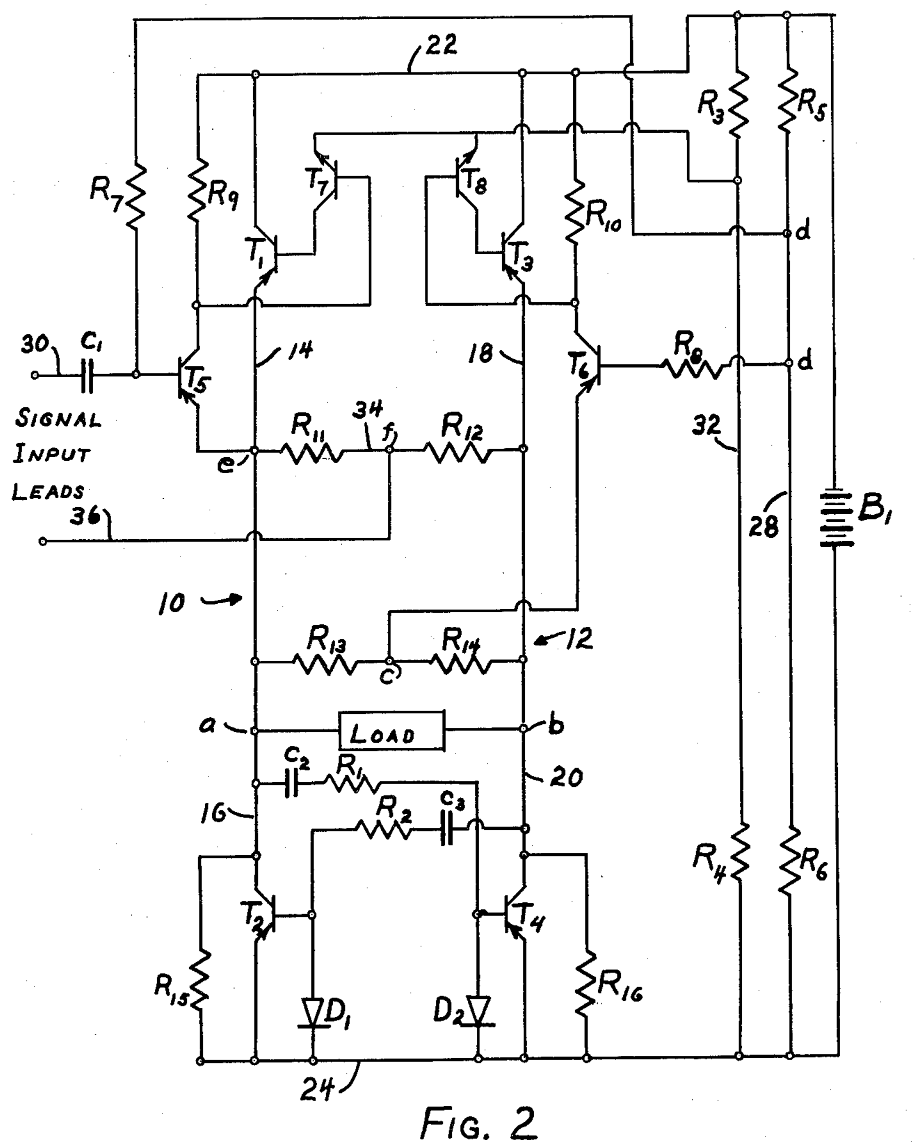
FIGURE 2 is a diagram similar to FIGURE 1 showing a class B amplifier.

The circuit described so far is a class A power amplifier in which the standby power losses exceed the maximum power output. FIGURE 2 shows a circuit in which these standby losses are largely eliminated permitting a higher power output within the thermal rating of the transistors. It will be noted that the current flowing under zero signal conditions does no useful work, and is therefore reduced to as low a value as possible. The standby current in $T_1$, $T_3$, is only that necessary to permit these transistors to control the action of the bridge. The standby current in $T_2$ and $T_4$ is essentially zero. $T_2$ and $T_4$ draw current only when required by the signal conditions.

The circuit shown in FIGURE 2 is a class B circuit and is identical with that of the class A amplifier shown in FIGURE 1 with the exception of the means of operating transistors $T_2$ and $T_4$. In the class A circuit, $R_1$ and $R_2$ conduct current under zero signal conditions. In the class B circuit, condensers $C_2$ and $C_3$ connected in series with $R_1$ and $R_2$ respectively prevent passage of current at zero signal conditions, and therefore resistor $R_{15}$ and $R_{16}$ are shunted across the emitters and collectors of $T_2$ and $T_4$ respectively to provide sufficient bias current through $T_1$ and $T_3$ to permit them to function. This bias current amounts to possibly 5% of full load current although the percentage is not critical. Since there is no base current in $T_2$ and $T_4$ under zero signal conditions, they will pass no current.

When a signal is applied, the A.C. signal voltage is applied to the bases of $T_2$ and $T_4$ through $C_2$, $R_1$, $C_3$ and $R_2$. As a result, $T_2$ conducts when the signal is such that the voltage drop across $T_4$ is high, and $T_4$ conducts when the signal is such that the voltage drop across $T_2$ is high. $R_1$ and $R_2$ are selected so that under maximum signal conditions a current greater than the maximum required load current flows through $T_2$ and $T_4$ respectively. $C_2$ and $C_3$ are selected so that in combination with $R_1$ and $R_2$ respectively, they will satisfactorily pass the lowest required frequency.

The base of a transistor acts as if it were a rectifier. If the A.C. signals were applied to the bases of $T_2$ and $T_4$ through $C_2$ and $C_3$, rectifying action of the bases would charge the condensers to the point where no base current would flow in response to signal. The effect is overcome by shunting the bases and emitters of $T_2$ and $T_4$ with diodes $D_1$ and $D_2$ installed so that their rectifying polarity is opposite to that of the transistor bases i.e., the diodes are arranged in back-to-back relation to the respective transistors. These diodes eliminate the charging effect on the capacitors, and permits the circuit to function.

It will be noted that the only portion of the cycle in which current flows in $T_2$ or $T_4$ is in that portion required to provide the signal current in the load. As a result, the standby load current has been reduced from over 50% of full load current to that value required for operation of $T_1$ and $T_3$, and the heat dissipation is reduced sufficiently to permit a power rating increase of several times without exceeding the ratings of the transistors.

Figure 3:
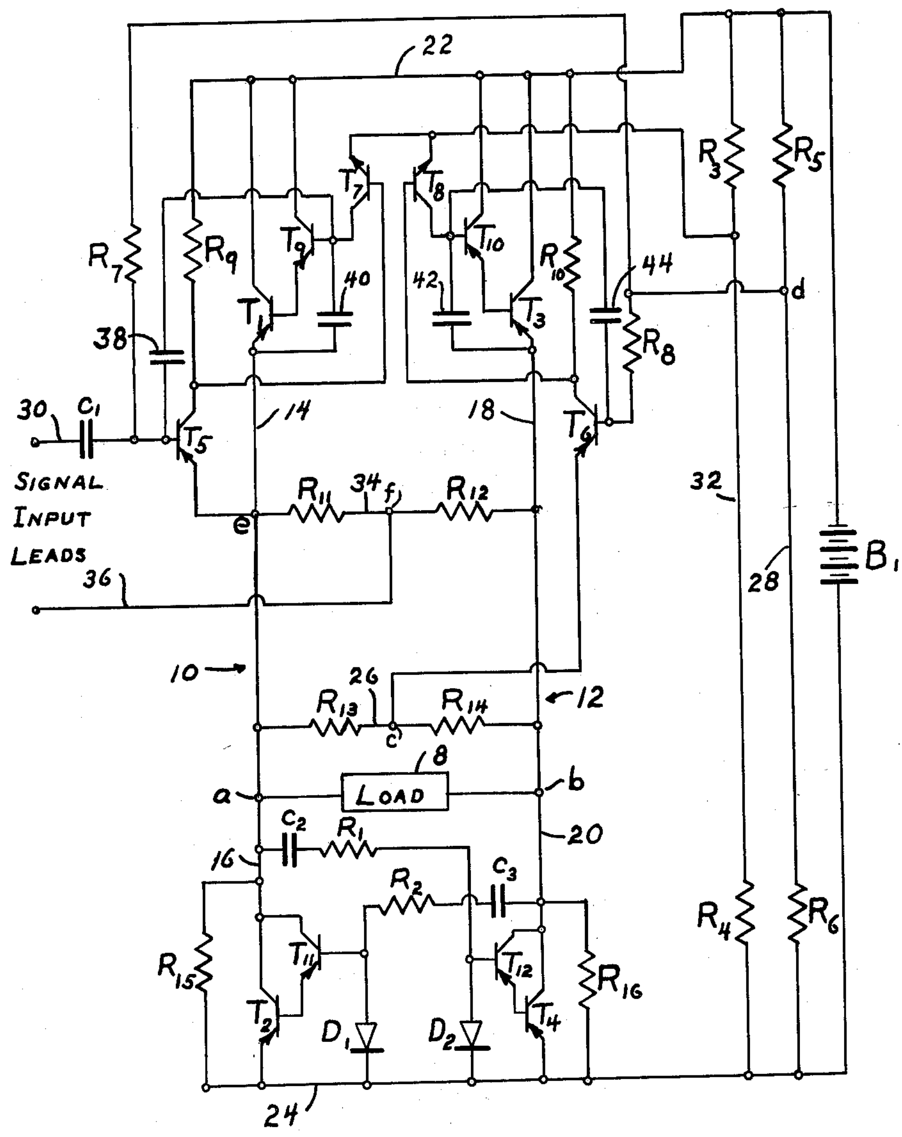
FIGURE 3 is a diagram similar to FIGURE 2 showing driver stages for all of the bridge transistors.

Practical considerations of amplifier design may require that additional current gain be provided in the drive circuits for $T_1$, $T_2$, $T_3$ and/or $T_4$. This current gain may be provided by the application of additional transistors as required in accordance with known techniques, one example of which is shown in FIGURE 3 wherein $T_9$ and $T_{10}$, and $T_{11}$ and $T_{12}$ are added. Transistors $T_9$ and $T_{10}$ reduce the power required from $T_7$ and $T_8$ (NPN types) and in addition their connection in cascade between $T_7$ and $T_1$ and between $T_8$ and $T_3$ respectively greatly increases the open loop voltage gain of the amplifier and as a result greatly improves its performance. The addition of $T_{11}$ and $T_{12}$ to the class B circuit feeding a signal tot he bases of $T_2$ and $T_4$ respectively permits the use of lower values and ratings for $C_2$, $C_3$, $D_1$ and $D_2$ and higher resistances for $R_1$ and $R_2$, as well as improving the low frequency response of the network.

Figure 4:
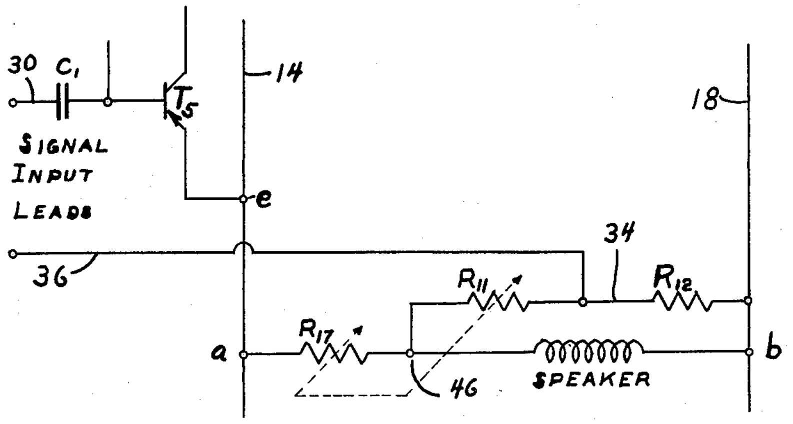
FIGURE 4 is a wiring diagram showing a modified feed back circuit for any of the circuits of FIGURES 1, 2 and 3.

A distinct advantage of this type of circuit is the variety of mechanisms by which, and ways in which, the feedback path may be connected. Loudspeakers have the characteristic of high input impedances at their low frequency resonant point, and as a result, high fidelity amplifiers have been designed in which the output impedance is adjustable to provide the best compromise between amplifier and loudspeaker characteristics. This adjustment is known as variable damping. A variable damping circuit is shown in the partial schematic in FIGURE 4. Variable damping is obtained by the addition of negative current feedback to the negative voltage feedback normally employed. Negative current feedback has the property of raising output impedance and reducing distortion. An adjustable resistor, $R_{17}$, is inserted between the load and point *e*. $R_{11}$ is made a variable resistor and is disconnected from point *e* and is connected to point 46. The voltage feedback to the signal return lead is now composed of voltage feedback from $R_{11}$ and $R_{12}$ and current feedback from $R_{17}$. The gain of the amplifier is made constant by ganging $R_{11}$ and $R_{17}$ so that the overall feedback ratio remains fixed. Adjustment of these variable resistors controls the amplifier damping ratio. These resistors may be fixed resistors if desired.

Figure 5:
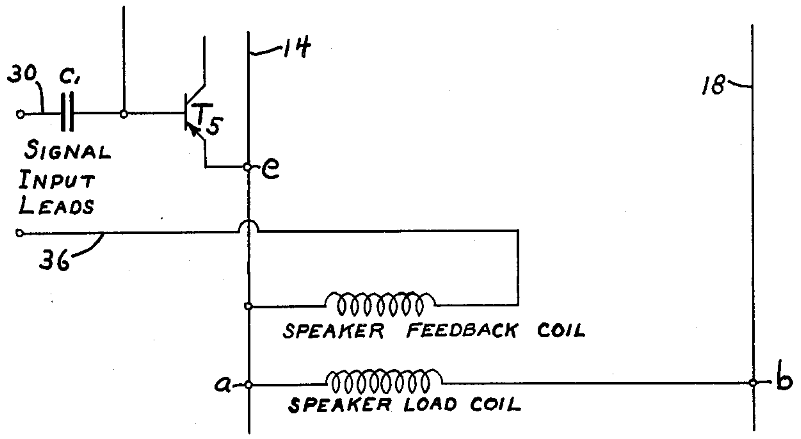
FIGURE 5 is a further modified feed back circuit for any of the circuits of FIGURES 1, 2 and 3.

Another highly desirable feedback mechanism is shown in the partial circuit of FIGURE 5. In this arrangement an additional coil is wound on the loudspeaker such that it generates a voltage which is proportional to the voice coil velocity and is connected between signal lead 36 and midpoint *a* of branch 10. The voltage generated by this coil is used as the amplifier voltage feedback. In this circuit, the high degree of feedback of the amplifier would act so as to cause the voice coil velocity to accurately represent the signal voltage. This feedback arrangement will effectively eliminate the dynamic characteristics of the loudspeaker from the audio loop and greatly improve the listening qualities of the system. Stability problems may require the combination of the circuitry of FIGURE 4 with this circuit for optimum performance.

The circuits presented herein will permit the construction of high-fidelity audio power amplifiers which will equal and/or surpass the performance of the best conventional designs at a cost and size which is below that of low qualtiy devices.

It should be understood that the invention is not limited to the specific modifications shown but includes equivalents falling within the scope of the appended claims.

What is claimed is:

1. A balanced bridge amplifier having two separate branches adapted to have two legs and a midpoint between the legs in each branch with the amplifier output connection directly across said midpoints of the two branches, means in one leg of one branch receiving a signal to change the voltage at the midpoint of said one branch, means in the corresponding adjacent leg of the other branch responsive to said changed voltage at said one midpoint changing the voltage at the midpoint of said other branch an equal amount in the opposite direction and amplifying means in the remaining legs of each respective branch connected by a connection with the midpoint of the respective opposite branch increasing the voltage difference between said midpoints.

2. A balanced bridge audio power amplifier having two separate branches with two legs and a midpoint between the legs in each branch adapted to have the load connected directly across said midpoints of the bridge branches and in which a transistor is arranged in each leg, means connected with one transistor and responsive to an unbalance in the bridge at zero signal varying the current in one leg of one branch to maintain the bridge in balance, a terminal for connecting a signal with one transistor in the other branch for varying the current in said one leg of said other branch in accordance with signal strength and means responsive to the voltage at the mid-point of each respective branch varying the current in the other leg of the respective opposite branch.

3. A power amplifier comprising four transistors having their collectors and emitters connected in a bridge circuit, said bridge having two branches with common terminals and two legs with a midpoint between the legs in each branch with one transistor in each leg, impedances connecting the midpoints of each respective branch of the bridge with the base of one transistor in the respective opposite branch, said bridge adapted to have a power source connected across the branch terminals, means responsive to an unbalance in said bridge connected with the base of the other transistor in one of said branches for varying the current in said one branch to restore the balance to said bridge, a signal terminal connected with the base of the fourth transistor and said bridge adapted to have a load connected directly across the midpoints of said branches.

4. A power amplifier comprising four transistors having their collectors and emitters connected as a bridge circuit, said bridge having two branches with common terminals and two legs with a midpoint between the legs in each branch with one transistor in each leg, impedances connecting the midpoint of each respective branch of the bridge with the base of one transistor in the opposite branch, said bridge adapted to have a power source connected across the branch terminals, and adapted to have a load connected directly across the midpoints of said branches, a voltage divider connecting the midpoints of said branches, means connecting the base of the other transistor in one branch with a selected voltage, with the midpoint of said one branch and with an input signal terminal, and means connecting the base of the other transistor in the other branch with a selected voltage and with the central portion of said divider.

5. An amplifier as claimed in claim 4 in which said first mentioned means comprises a fifth transistor having its base connected with said selected voltage and said signal terminal, its emitter connected with the midpoint of said one branch and its collector electrically connected with said base of said other transistor in said one branch, and in which said second mentioned means comprises a sixth transistor having its base connected to said selected voltage, its emitter connected to said central portion and its collector electrically connected with said base of said other transistor in said other branch.

6. An amplifier as claimed in claim 5 having power source connections at the branch terminals and in which said collector electrical connections of said fifth and sixth transistors comprise connections via the bases of seventh and eighth transistors, respectively, whose collectors are connected with the base of the respective branch transistor and in which the collectors of fifth and sixth transistors are connected through respective impedances with one of said terminals.

7. A power amplifier comprising four transistors having their collectors and emitters connected as a bridge circuit, said bridge having two branches with common terminals and two legs with a midpoint between the legs in each branch with one transistor in each leg, impedances connecting the midpoint of each branch of the bridge with the base of one transistor in the opposite branch, said bridge adapted to have a power source connected across the branch terminals, load connections at the midpoints of said branches, a pair of signal input leads, means connecting one lead with the base of the other transistor in one of said branches for changing the voltage at the midpoint of said one branch responsive to a signal, a voltage divider connecting said midpoints, means connecting the central part of said divider with the base of the other transistor in the other branch for varying the current in said other transistor in said other branch to change the voltage at the midpoint of said other branch an amount equal to and in a direction opposite to the signal produced voltage change at the midpoint of said one branch, a second voltage divider connecting said midpoints and means connecting the other signal lead with said second voltage divider to provide a negative feed back.

8. An amplifier as claimed in claim 4 in which said impedances comprise resistors and condensers in series.

9. An amplifier as claimed in claim 8 including a rectifier connecting the transistor connected end of said impedances with the adjacent branch terminal in back to back relation to the respective transistor.

10. An amplifier as claimed in claim 8 including a resistor connected across the emitter and collector of said one transistor in said opposite branch.

11. A balanced bridge amplifier said bridge having two branches with common terminals and two legs with a midpoint between the legs in each branch having power connections at the branch terminals and load connections at the midpoints of the bridge branches, each branch comprising two transistors, one in each leg of the respective branch, connected in series with the collector of one transistor connected with the emitter of the other, means connecting the midpoint of each respective branch with the base of the transistor in one leg of the respective opposite branch, a signal lead electrically connected with the base of the other transistor of one branch, and means maintaining the voltage at said midpoint at preselected equal values at zero signal condition comprising a voltage divider connecting said midpoints and means electrically connecting the central point of said divider with the base of the transistor in the other leg of the other branch.

12. A balanced bridge amplifier said bridge having two branches with common terminals and two legs with a midpoint between the legs in each branch adapted to have a power source connected across the bridge branch terminals, and adapted to have the load connected directly across the midpoints of the bridge branches, comprising a first transistor having its emitter and collector forming part of the circuit of one leg of one branch and a second transistor having its emitter and collector forming part of the circuit of a corresponding leg of the other branch, means maintaining the midpoints of said respective branches at preselected equal voltage at zero signal conditions and changing the voltage at one midpoint an amount equal to and in a direction opposite to, a signal induced voltage change at the other midpoint comprising a signal lead and voltage source connected to the base of said first transistor, a voltage divider connecting said midpoints, means connecting the central portion of said divider and said voltage source with the base of said second transistor.

13. An amplifier as claimed in claim 12 in which a power source is connected across the bridge terminal and said voltage source is a voltage divider connected across said power source.

14. An amplifier as claimed in claim 12 in which the connection between said voltage source and said first transistor comprises a third transistor having its base connected to said voltage source, its emitter connected to the midpoint of said one branch and its collector connected in cascade with said first transistor base.

15. An amplifier as claimed in claim 12 in which the connection between said voltage source and said second transistor comprises a transistor having its base connected to said voltage source, its emitter connected to the central portion of said divider and its collector connected in cascade with the base of said second transistor.

16. An amplifier as claimed in claim 14 in which the return signal lead is connected to the emitter of said third transistor through means providing a voltage responsive to the voltage difference across said midpoints to provide a negative feed back signal.

17. An amplifier as claimed in claim 3 including a return signal terminal having a connection with the emitter of said fourth transistor said connection including mechanism providing a negative feed back.

18. An amplifier as claimed in claim 17 in which said connection includes mechanism responsive to the voltage applied to said load and to the current in said load.

19. An amplifier as claimed in claim 17 in which said load comprises a moving coil and said connection includes mechanism providing a voltage proportional to the coil velocity.

20. An amplifier as claimed in claim 17 in which said load comprises a speaker having a voice coil and said mechanism comprises a coil arranged in operative relation with said voice coil to generate a voltage proportional to the voice coil velocity.

21. Means for automatically balancing a balanced bridge amplifier under zero signal conditions, said bridge having two branches with common terminals and two legs with a midpoint between the legs in each branch adapted to have a power source connected across the bridge branch terminals and adapted to have an amplifier output load connected directly across the midpoints of the bridge branches, comprising means comparing the voltage at one midpoint with a reference voltage and maintaining said one midpoint at a selected voltage by varying the current in one branch, and means comparing the average of the voltage of the midpoints with said reference voltage and maintaining the other midpoint at said selected voltage by varying the current in the other branch.

22. A bridge balancing means as claimed in claim 21 having means for applying a signal to said comparing means for said one midpoint and varying said one midpoint voltage in accordance with said signal, said average voltage comparing means including means varying the voltage at the other midpoint an amount equal to but inverse to departure of said one midpoint from said selected voltage.

23. In a bridge balancing means having comparing means as claimed in claim 22 in which each said comparing means comprises a transistor having its base connected with the reference voltage, its emitter connected with the voltage point to be compared and its collector connected through amplifying means with current controlling means in the respective branch.

24. In a bridge balancing means having current controlling means as claimed in claim 23 in which each current controlling means comprises a transistor having its base connected with the respective amplifying means and its emitter and collector forming part of the branch circuit.

25. A bridge balancing means as claimed in claim 22 in which one signal line is connected with the reference voltage side of said comparing means for said one midpoint and the return signal line is connected to the midpoint side of the comparing means for said one midpoint through means producing a voltage proportional to the bridge output and acting as a negative feedback to said comparing means for said one midpoint.

26. An amplifier as claimed in claim 1 in which the connection between the amplifying means and the midpoint of the opposite branch includes a condenser and a resistor in series for class B operation.

27. In a balanced bridge amplifier said bridge having two branches with common terminals and two legs with a midpoint between the legs in each branch adapted to have a power source connected across the branch terminals and adapted to have the load connected directly across the midpoints of the bridge branches, means maintaining the voltage at the midpoint of one branch in accordance with a reference voltage and means varying said midpoint voltage in accordance with the strength of a signal applied to said one branch, means responsive to the average voltage of said load, means comparing said average voltage with said reference voltage and varying the voltage at the midpoint of the other branch inversely in accordance with variations of said average voltage from said reference voltage.

28. In a balanced bridge power amplifier said bridge having two branches with common terminals and two legs with a midpoint between the legs in each branch having transistors connected as a bridge circuit with a first transistor in one branch and a second transistor in the other branch, said bridge adapted to have a power source connected across the branch terminals and adapted to have a load connected directly across the branch midpoints, a voltage divider connecting the midpoints of said branches, a first means connecting the base of said first transistor with a reference voltage, an input signal terminal and the midpoint of said one branch and a second means connecting the base of said second transistor with said reference voltage and the central portion of said divider.

29. An amplifier as claimed in claim 14 having a return signal lead in which the return signal lead is connected to the emitter of said third transistor through means providing a negative feedback voltage responsive to the voltage applied to said load and to the current in said load.

30. An amplifier as claimed in claim 14 having a return signal lead and a load, in which said load includes a moving coil and the return signal lead is connected to the emitter of said third transistor through said coil to provide a negative feedback.

31. An amplifier as claimed in claim 14 having a return signal lead and a load, in which the load is connected across said midpoints and is a speaker having a voice coil and another coil arranged in operative relation with said voice coil to generate a voltage proportional to the voice coil velocity, and in which the return signal lead is connected with the emitter of said third transistor through said another coil.

32. A balanced bridge amplifier having two separate branches with two legs and a midpoint between the legs in each branch, amplifier output connections at said midpoints, a transistor in one leg of one branch receiving a signal to change the voltage at the midpoint of said one branch, a transistor in the adjacent leg of the other branch responsive to said changed voltage at said one midpoint changing the voltage at the midpoint of said other branch an equal amount in the opposite direction and amplifying means comprising transistors in the remaining legs of each respective branch connected by a connection with the midpoint of the respective opposite branch increasing the voltage difference between said midpoints.

References Cited in the file of this patent

UNITED STATES PATENTS

| | | |
|---|---|---|
| 1,645,282 | Hanna | Oct. 11, 1927 |
| 1,822,758 | Toulon | Sept. 8, 1931 |
| 2,194,175 | Wilhelm | Mar. 19, 1940 |
| 2,561,425 | Stachura | July 24, 1951 |
| 2,590,104 | King | Mar. 25, 1952 |
| 2,631,198 | Parisoe | Mar. 10, 1953 |
| 2,638,512 | Bessey | May 12, 1953 |
| 2,787,672 | Crosby | Apr. 2, 1957 |
| 2,860,183 | Conrad | Nov. 11, 1958 |
| 2,930,985 | Basharrah | Mar. 29, 1960 |
| 2,959,741 | Murray | Nov. 8, 1960 |